(12) United States Patent
Kim

(10) Patent No.: US 10,848,162 B2
(45) Date of Patent: Nov. 24, 2020

(54) SEMICONDUCTOR APPARATUS INCLUDING CLOCK GENERATION CIRCUIT AND SEMICONDUCTOR SYSTEM USING THE SAME

(71) Applicant: SK hynix Inc., Icheon-si (KR)

(72) Inventor: Kyu Young Kim, Guri-si (KR)

(73) Assignee: SK hynix Inc., Icheon-si (KR)

( * ) Notice: Subject to any disclaimer, the term of this patent is extended or adjusted under 35 U.S.C. 154(b) by 224 days.

(21) Appl. No.: 15/802,216

(22) Filed: Nov. 2, 2017

(65) Prior Publication Data

US 2018/0331686 A1 Nov. 15, 2018

(30) Foreign Application Priority Data

May 11, 2017 (KR) .................. 10-2017-0058826

(51) Int. Cl.
| | |
|---|---|
| *G06F 1/00* | (2006.01) |
| *H03L 7/085* | (2006.01) |
| *H03K 5/135* | (2006.01) |
| *G06F 1/08* | (2006.01) |
| *G06F 1/06* | (2006.01) |
| *G01R 31/317* | (2006.01) |

(52) U.S. Cl.
CPC ............ *H03L 7/085* (2013.01); *G01R 31/317* (2013.01); *G06F 1/06* (2013.01); *G06F 1/08* (2013.01); *H03K 5/135* (2013.01)

(58) Field of Classification Search
CPC ............ H03L 7/085; H03K 5/135; G06F 1/08
See application file for complete search history.

(56) References Cited

U.S. PATENT DOCUMENTS

| | | | | |
|---|---|---|---|---|
| 7,602,876 B2 | 10/2009 | Harrison | | |
| 2001/0048634 A1* | 12/2001 | Maeda | .................. | G11C 7/1072 365/233.1 |
| 2003/0156107 A1* | 8/2003 | Sakashita | ............... | G09G 5/008 345/213 |
| 2008/0272819 A1* | 11/2008 | Cheng | ....................... | G06F 1/10 327/298 |
| 2010/0117692 A1* | 5/2010 | Yoon | ....................... | H03K 5/13 327/144 |

FOREIGN PATENT DOCUMENTS

KR 1020130032505 A 4/2013

\* cited by examiner

*Primary Examiner* — Xuxing Chen
(74) *Attorney, Agent, or Firm* — William Park & Associates Ltd.

(57) ABSTRACT

A semiconductor apparatus may be provided. The semiconductor apparatus may include a clock generation circuit. The clock generation circuit may be configured to receive data clock signals and generate internal clock signals in both a first and second operation mode.

22 Claims, 7 Drawing Sheets

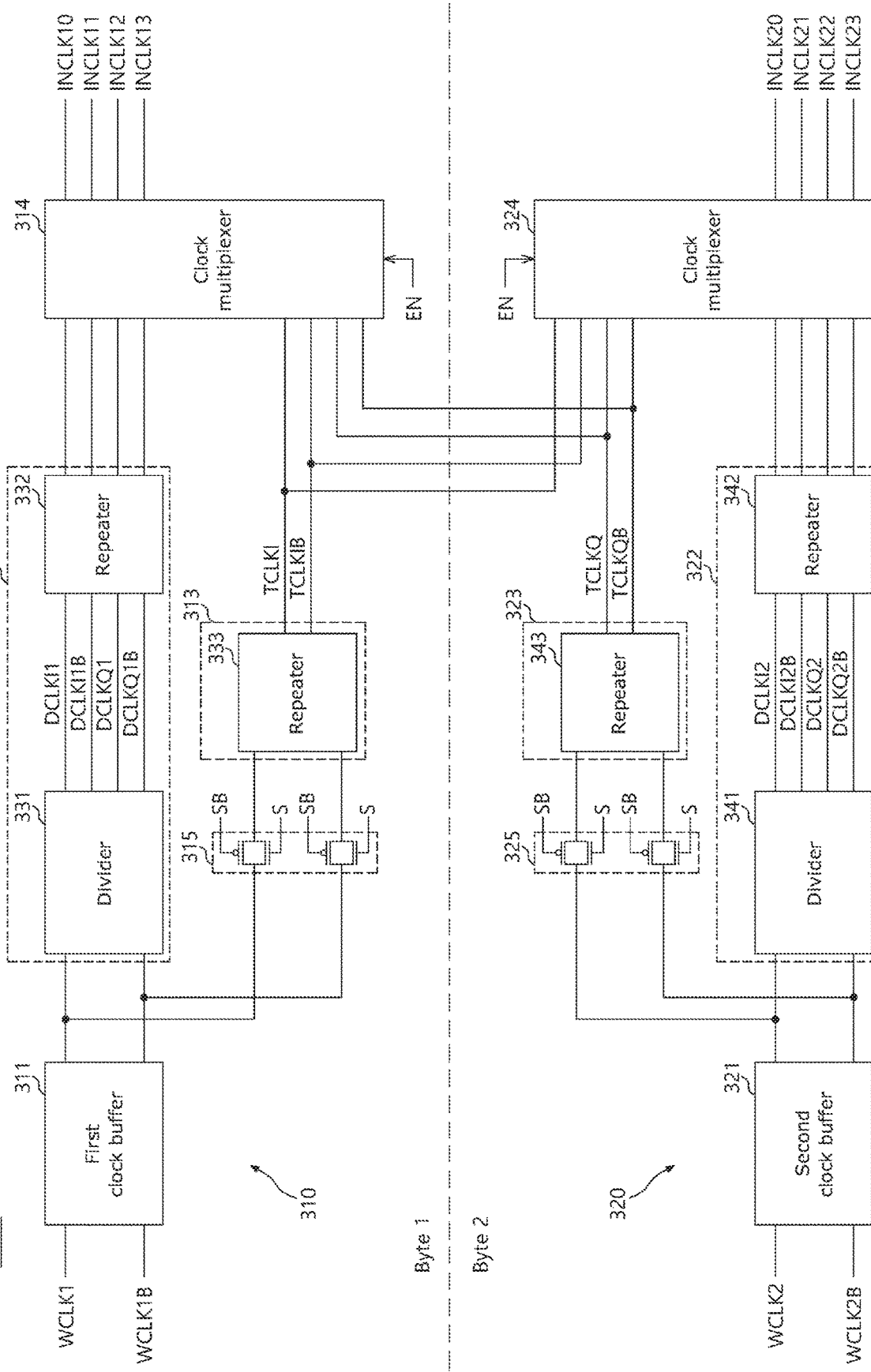

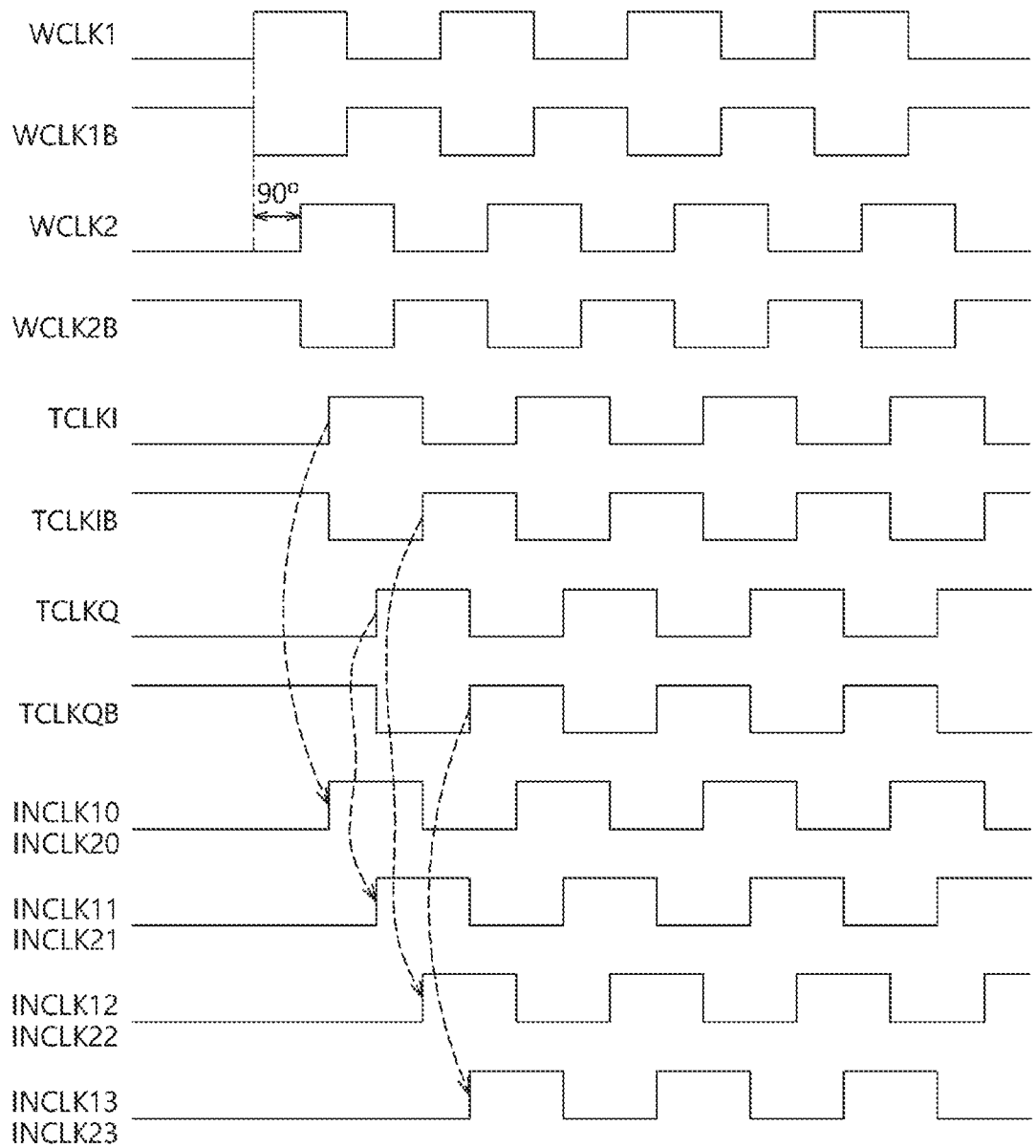

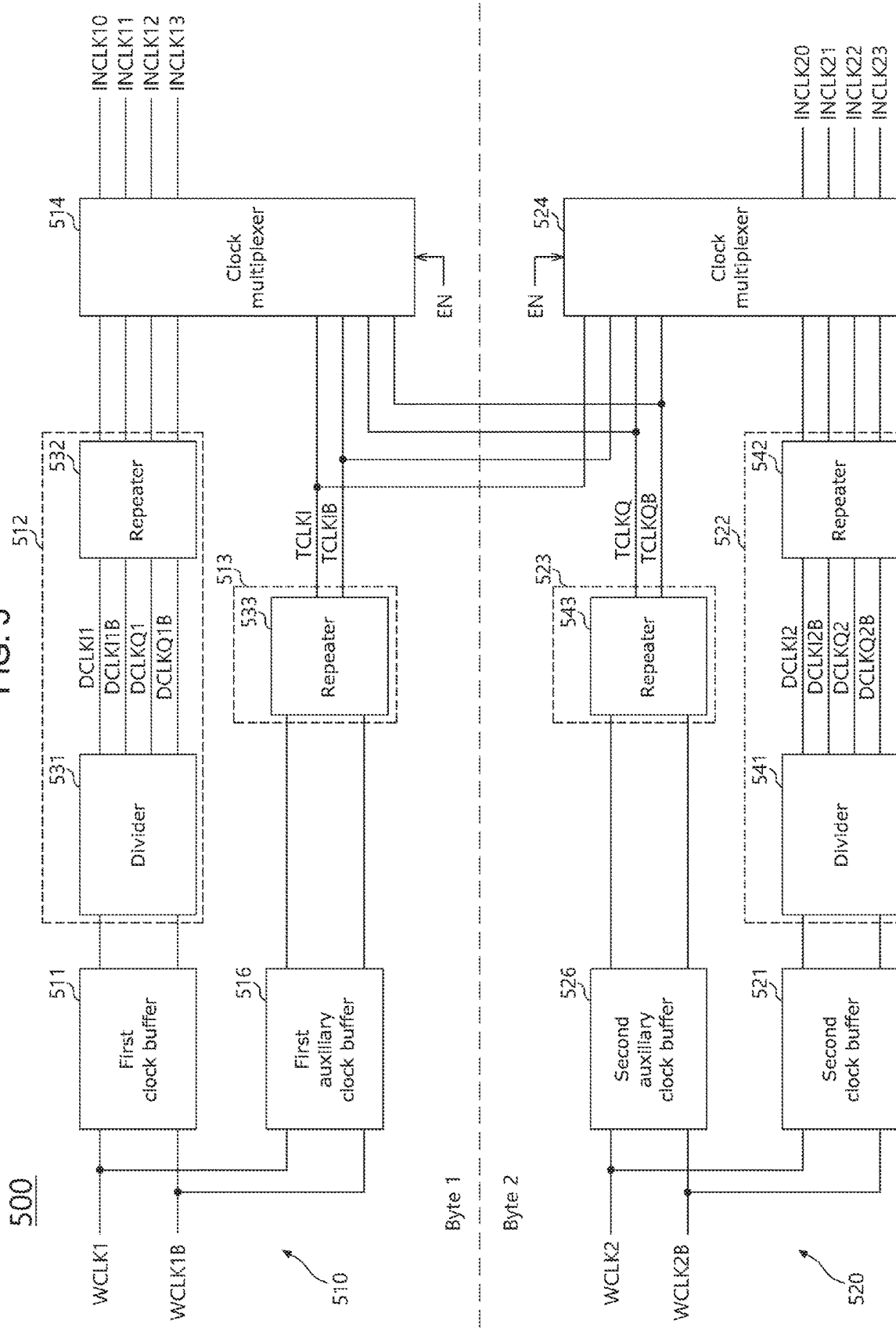

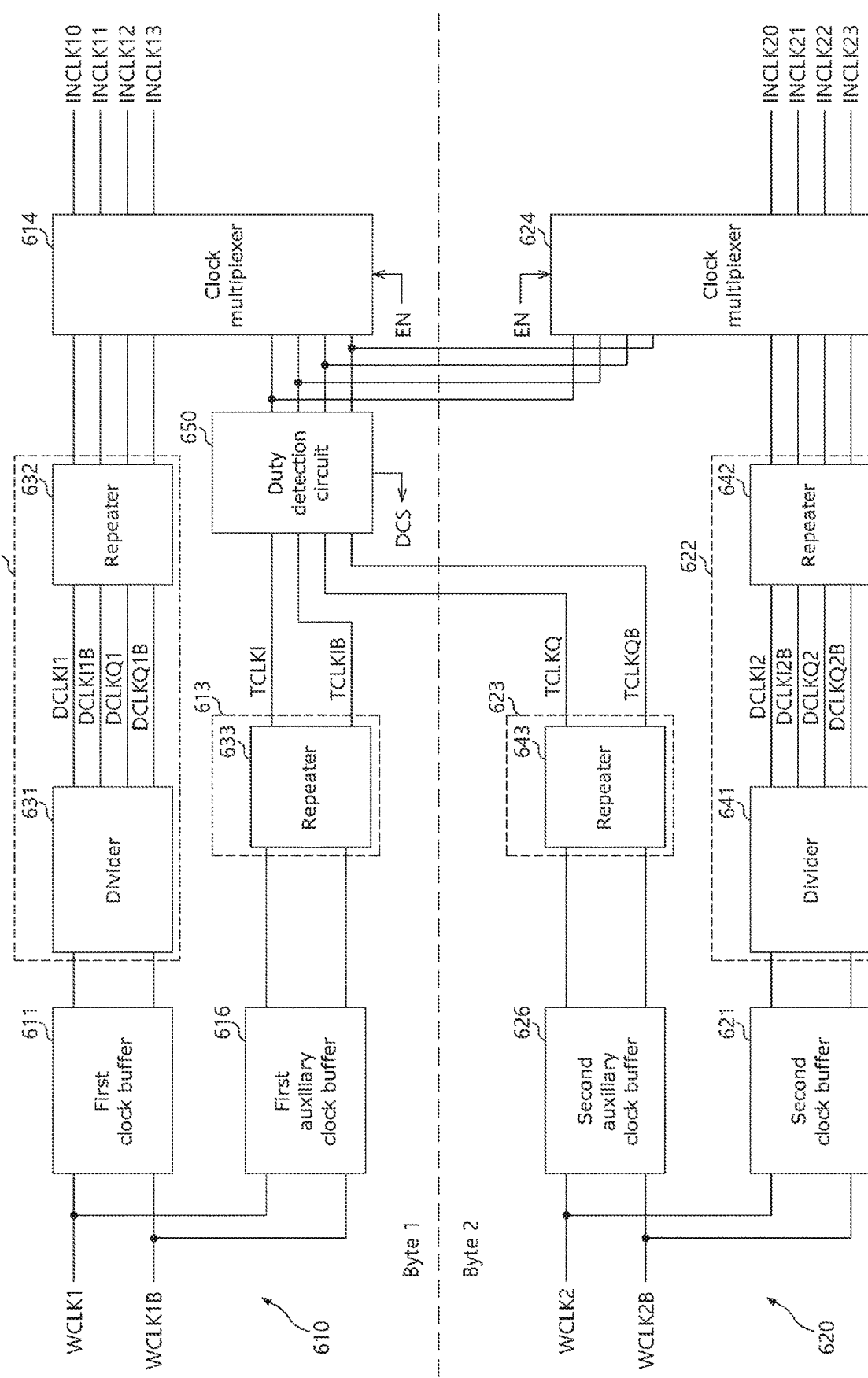

SEMICONDUCTOR APPARATUS INCLUDING CLOCK GENERATION CIRCUIT AND SEMICONDUCTOR SYSTEM USING THE SAME

CROSS-REFERENCES TO RELATED APPLICATION

The present application claims priority under 35 U.S.C. § 119(a) to Korean application number 10-2017-0058826, filed on May 11, 2017, in the Korean Intellectual Property Office, which is incorporated herein by reference in its entirety.

BACKGROUND

1. Technical Field

Various embodiments may generally relate to a semiconductor technology, and, more particularly, to a clock generation circuit, a semiconductor apparatus, and a semiconductor system.

2. Related Art

An electronic apparatus may include a large number of electronic components. A computer system as an electronic apparatus may include many electronic components which are configured from semiconductor apparatuses. The semiconductor apparatuses which make up the computer system may transmit and receive data in synchronization with a clock signal. As the operating speed of the system increases, the speed of the clock signals continue to increase, and also, the semiconductor apparatuses which make up the system are designed to operate at a higher frequency. In order to perform an accurate test on such semiconductor apparatuses, test equipment for testing the semiconductor apparatuses should be capable of providing a high-speed clock signal. Test equipment for testing the semiconductor apparatuses is expensive, and thus, a manufacturer of the semiconductor apparatuses may not frequently replace the test equipment in conformity with the development speed of the semiconductor apparatuses. Therefore, there is a need for a method capable of performing a high-speed test on a semiconductor apparatus through using test equipment that performs relatively poor.

SUMMARY

In an embodiment, a semiconductor apparatus may be provided. The semiconductor apparatus may include a clock generation circuit configured to receive data clock signals from an external apparatus, receive a first clock signal pair having a first frequency as the data clock signals in a first operation mode, receive a second clock signal pair having a second frequency and a third clock signal pair having a predetermined phase difference from the second clock signal pair as the data clock signals in a second operation mode, and generate a plurality of internal clock signals having the second frequency. The semiconductor apparatus may include a data input and output (input/output) circuit configured to receive or transmit data based on the plurality of internal clock signals.

In an embodiment, a semiconductor system may be provided. The semiconductor system may include an external apparatus configured to provide first data clock signals and second data clock signals having the same frequency as the first data clock signals and a phase difference of 90 degrees from the first data clock signals, and adjust phases of the first and second data clock signals based on a duty information. The semiconductor system may include a semiconductor apparatus configured to generate first test clock signals and second test clock signals based on the first and second data clock signals, provide the first and second test clock signals as a plurality of internal clock signals, and generate the duty information by detecting duty ratios of the first and second data clock signals.

In an embodiment, a semiconductor apparatus may be provided. The semiconductor apparatus may include a clock generation circuit configured to receive data clock signals having at least one frequency different from another and generate internal clock signals in both a first and second operation mode based on the received data clock signals. The internal clock signals may be generated in the first operation mode having substantially the same frequency and phase difference as the internal clock signals generated in the second operation mode.

BRIEF DESCRIPTION OF THE DRAWINGS

FIG. 3 is a diagram illustrating a representation of an example of the configuration of a clock generation circuit in accordance with an embodiment.

FIGS. 4A and 4B are representations of examples of waveform diagrams to assist in the explanation of the operations of the semiconductor system and the clock generation circuit in accordance with the embodiments.

FIG. 5 is a diagram illustrating a representation of an example of the configuration of a clock generation circuit in accordance with an embodiment.

FIG. 6 is a diagram illustrating a representation of an example of the configuration of a clock generation circuit in accordance with an embodiment.

DETAILED DESCRIPTION

Hereinafter, a semiconductor apparatus including a clock generation circuit and a semiconductor system will be described below with reference to the accompanying drawings through various examples of embodiments.

Figure 1:
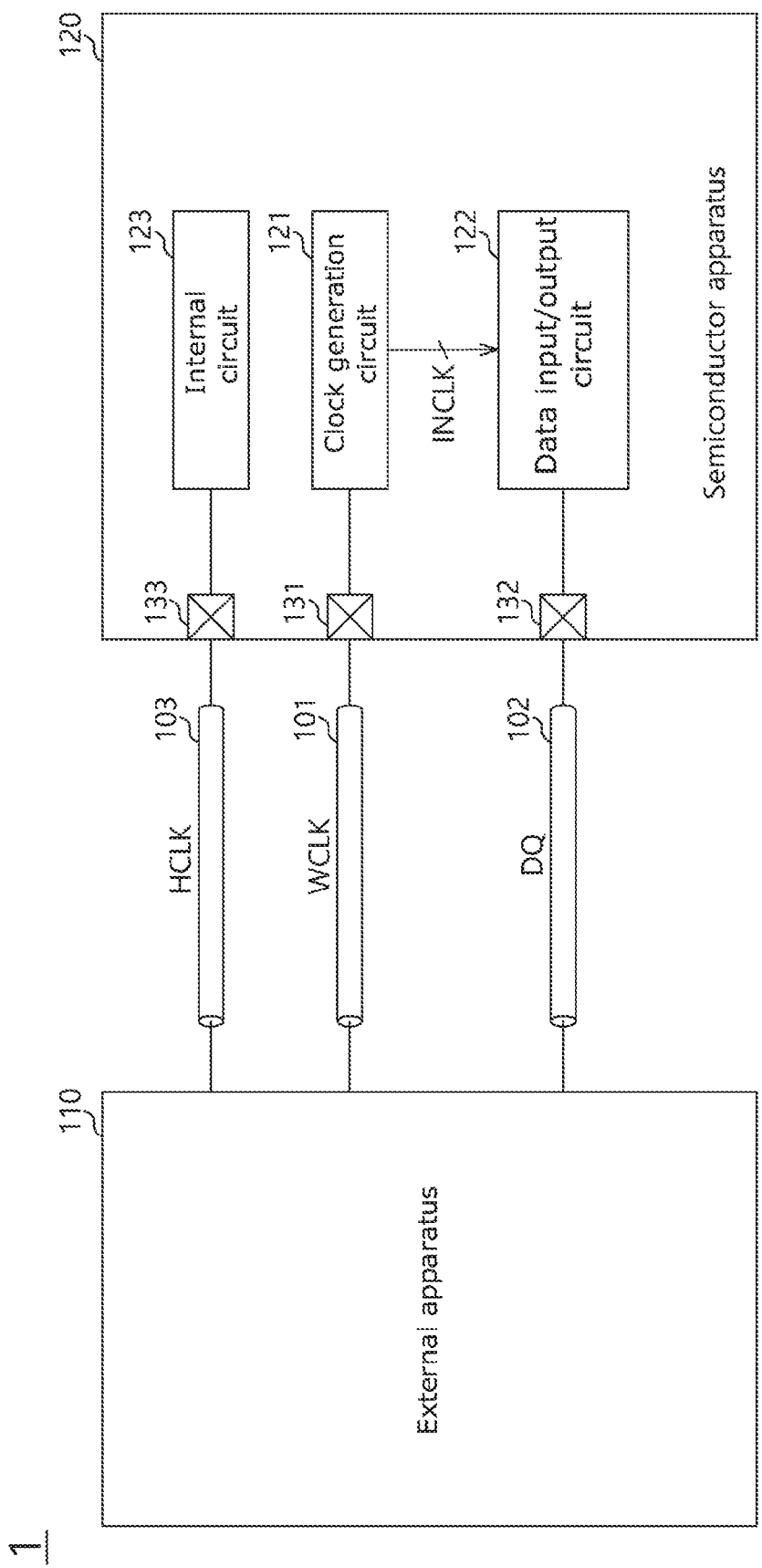
FIG. 1 is a diagram illustrating a representation of an example of the configuration of a semiconductor system in accordance with an embodiment.

FIG. 1 is a diagram illustrating a representation of an example of the configuration of a semiconductor system 1 in accordance with an embodiment. Referring to FIG. 1, the semiconductor system 1 may include an external apparatus 110 and a semiconductor apparatus 120. The external apparatus 110 may provide various control signals necessary for the semiconductor apparatus 120 to operate. The external apparatus 110 may include various kinds of apparatuses. For example, the external apparatus 110 may be a host apparatus such as a central processing unit (CPU), a graphic processing unit (GPU), a multimedia processor (MMP), a digital signal processor, an application processor AP and a memory controller. The external apparatus 110 may be a test apparatus or test equipment for testing the semiconductor apparatus 120. The semiconductor apparatus 120 may be a memory apparatus, and the memory apparatus may include a volatile memory or a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM).

The semiconductor apparatus 120 may be coupled with the external apparatus 110 which functions as a host apparatus in a first operation mode. The semiconductor apparatus 120 may be coupled with the external apparatus 110 which functions as test equipment in a second operation mode. The second operation mode may be referred to as a test operation, and the first operation mode may be referred to as all operations except the test operation. For example, after the semiconductor apparatus 120 is manufactured, the semiconductor apparatus 120 may be tested by being coupled with the external apparatus 110 functioning as test equipment. After a test is completed, the semiconductor apparatus 120 may perform various operations by being coupled with the external apparatus 110 functioning as a host apparatus.

The semiconductor apparatus 120 may be coupled with the external apparatus 110 through a plurality of buses. The plurality of buses may be signal transmission paths, links or channels for transmitting signals. The plurality of buses may include a command bus, an address bus, a clock bus and a data bus. FIG. 1 illustrates only clock buses through which clock signals are transmitted and a data bus through which data is transmitted. The clock buses may be unidirectional buses, and the data bus may be a bidirectional bus. The semiconductor apparatus 120 may be coupled with the external apparatus 110 through a first clock bus 101 and receive data clock signals WCLK and WCLKB through the first clock bus 101. The data clock signals WCLK and WCLKB may include a plurality of data clock signal pairs. The data clock signal WCLKB may be a complementary clock signal of the data clock signal WCLK. The semiconductor apparatus 120 may be coupled with the external apparatus 110 through a data bus 102, and may receive data DQ from the external apparatus 110 or transmit data DQ to the external apparatus 110, through the data bus 102. The semiconductor apparatus 120 may further include a second clock bus 103, and may additionally receive a system clock signal HCLK transmitted from the external apparatus 110, through the second clock bus 103.

The semiconductor apparatus 120 may include a clock generation circuit 121, a data input/output circuit 122 and an internal circuit 123. The clock generation circuit 121 may be coupled with the first clock bus 101 through a clock pad 131, and may receive the data clock signals WCLK and WCLKB and generate a plurality of internal clock signals INCLK. In the first operation mode, the clock generation circuit 121 may receive a first clock signal pair having a first frequency as the data clock signals WCLK and WCLKB and generate the plurality of internal clock signals INCLK. In the second operation mode, the clock generation circuit 121 may receive a second clock signal pair having a second frequency and a third clock signal pair having the second frequency and a predetermined phase difference from the second clock signal pair as the data clock signals WCLK and WCLKB and generate the plurality of internal clock signals INCLK. Without a limiting sense, for example, the second frequency may be half of the first frequency, and the predetermined phase difference may be 90 degrees. In the first operation mode, the clock generation circuit 121 may receive the data clock signals WCLK and WCLKB having the first frequency, divide the data clock signals WCLK and WCLKB and generate the plurality of internal clock signals INCLK. In the second operation mode, the clock generation circuit 121 may receive the data clock signals WCLK and WCLKB having the second frequency, buffer the data clock signals WCLK and WCLKB and generate the plurality of internal clock signals INCLK. The plurality of internal clock signals INCLK may have a phase difference of 90 degrees from one another and have the second frequency.

The data input/output circuit 122 may be coupled with the data bus 102 through a data pad 132, and may receive data DQ transmitted from the external apparatus 110 or transmit data DQ to the external apparatus 110. The data input/output circuit 122 may receive the plurality of internal clock signals INCLK generated from the clock generation circuit 121. The data input/output circuit 122 may perform input/output operations for data DQ based on the plurality of internal clock signals INCLK. The data input/output circuit 122 may transmit data DQ to the external apparatus 110 in synchronization with the plurality of internal clock signals INCLK, and may receive data DQ transmitted from the external apparatus 110 in synchronization with the plurality of internal clock signals INCLK. The internal circuit 123 may include any logic circuit except the clock generation circuit 121 and the data input/output circuit 122 among logic circuits configuring the semiconductor apparatus 120. The internal circuit 123 may be coupled with the second clock bus 103 through a clock pad 133. The internal circuit 123 may receive the system clock signal HCLK through the second clock bus 103. The internal circuit 123 may perform various operations based on the system clock signal HCLK. For example, the internal circuit 123 may receive a control signal such as a command signal from the external apparatus 110 based on the system clock signal HCLK. For example, the semiconductor apparatus 120 may enter a slip mode such as a power-down mode, a standby mode or a deep power-down mode or enter an active mode by exiting the slip mode, based on the command signal.

Figure 2:
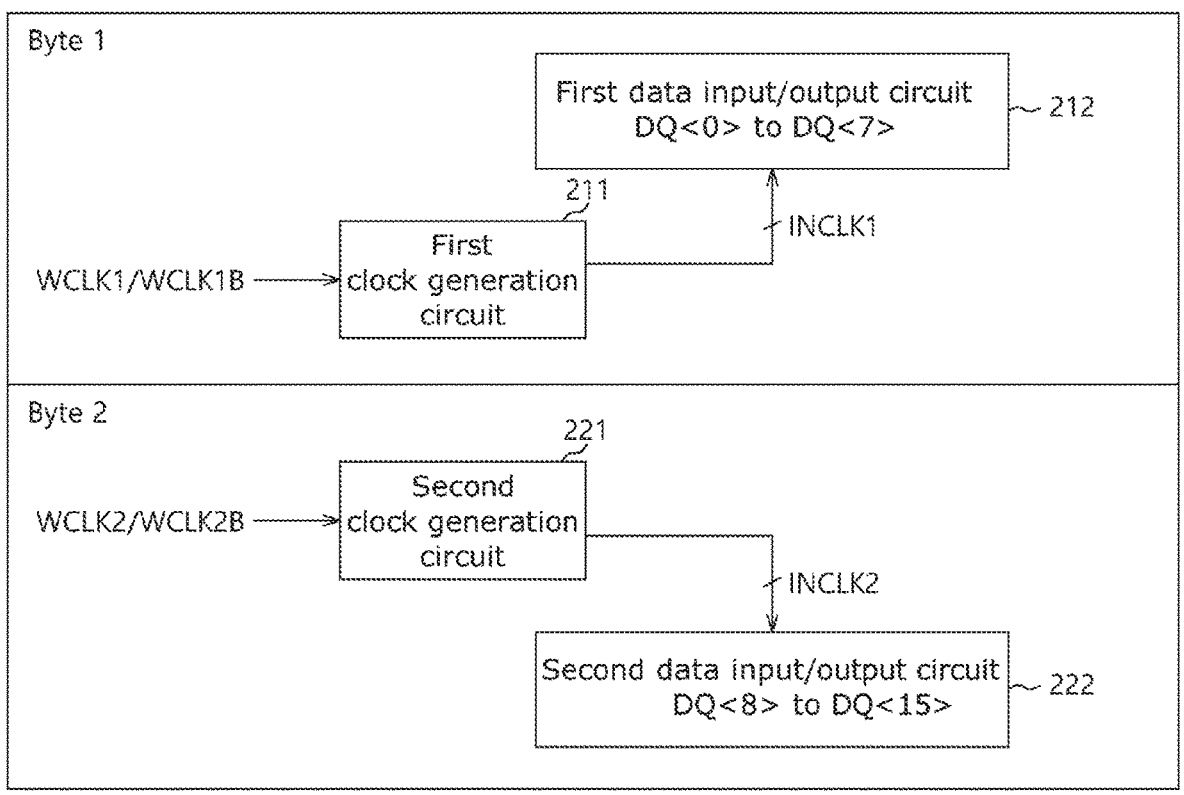
FIG. 2 is a diagram schematically illustrating a representation of an example of the configuration of a semiconductor apparatus in accordance with an embodiment.

FIG. 2 is a block diagram schematically illustrating a representation of an example of the configuration of a semiconductor apparatus 200 in accordance with an embodiment. The semiconductor apparatus 200 may operate by being divided into a plurality of byte regions. The byte regions may be regions which are physically divided or regions which are not physically divided but are logically divided. The semiconductor apparatus 200 may include a first byte region Byte 1 and a second byte region Byte 2. The semiconductor apparatus 200 may include a first clock generation circuit 211 and a first data input/output circuit 212 which are disposed in the first byte region Byte 1 and a second clock generation circuit 221 and a second data input/output circuit 222 which are disposed in the second byte region Byte 2. The first and second clock generation circuits 211 and 221 may be the components of the clock generation circuit 121 of FIG. 1, and the first and second data input/output circuits 212 and 222 may be the components of the data input/output circuit 122 of FIG. 1. The semiconductor apparatus 200 may operate by receiving a high-speed clock signal. As the frequency of a clock signal increases, the pulse width and amplitude of the clock signal may decrease. Therefore, as the frequency of a clock signal for processing data of the same bandwidth increases, it may be difficult to ensure precise data input/output operations. For example, when assuming that the bandwidth of data is 16, in the case of performing all input/output operations for 16 data by using internal clock signals generated from a pair of data clock signals, because the loadings of the internal clock signals are too large, it may be difficult to precisely perform the data input/output operations. Thus, the semiconductor apparatus 200 may separate and use internal clock signals to be used in input/output operations for data. For example, the first clock generation circuit 211 may generate a plurality of first internal clock signals INCLK1 from first data clock signals WCLK1 and WCLK1B, and the first data input/output circuit 212 may perform input/output operations for first to eighth data DQ<0> to DQ<7> based on the first internal clock signals INCLK1. The second clock generation circuit 221 may generate a plurality of second internal clock signals INCLK2 from second data clock signals WCLK2 and WCLK2B, and the second data input/output circuit 222 may perform input/output operations for ninth to sixteenth data DQ<8> to DQ<15> based on the second internal clock signals INCLK2. By performing input/output operations by being separated into byte regions, the semiconductor apparatus 200 may extend the valid window, eye and/or duration of data even when operating based on clock signals having a high frequency.

FIG. 3 is a diagram illustrating a representation of an example of the configuration of a clock generation circuit 300 in accordance with an embodiment. The clock generation circuit 300 may be applied as the clock generation circuits 121, 211 and 221 illustrated in FIGS. 1 and 2. The clock generation circuit 300 may receive data clock signals and generate a plurality of internal clock signals. In a first operation mode of a semiconductor apparatus, the clock generation circuit 300 may receive a first clock signal pair as the data clock signals and generate the plurality of internal clock signals based on the data clock signals. In a second operation mode of the semiconductor apparatus, the clock generation circuit 300 may receive second and third clock signal pairs as the data clock signals and generate the plurality of internal clock signals based on the data clock signals.

The clock generation circuit 300 may include a first clock generation circuit 310 and a second clock generation circuit 320. The first clock generation circuit 310 may be disposed in a first byte region Byte 1, and may receive first data clock signals WCLK1 and WCLK1B and generate a plurality of first internal clock signals INCLK10, INCLK11, INCLK12 and INCLK13. The second clock generation circuit 320 may be disposed in a second byte region Byte 2, and may receive second data clock signals WCLK2 and WCLK2B and generate a plurality of second internal clock signals INCLK20, INCLK21, INCLK22 and INCLK23. The first clock generation circuit 310 may receive the first clock signal pair as the first data clock signals WCLK1 and WCLK1B in the first operation mode, and may receive the second clock signal pair as the first data clock signals WCLK1 and WCLK1B in the second operation mode. The second clock generation circuit 320 may receive the first clock signal pair as the second data clock signals WCLK2 and WCLK2B in the first operation mode, and may receive the third clock signal pair as the second data clock signals WCLK2 and WCLK2B in the second operation mode.

The first clock generation circuit 310 may include a first clock buffer 311, a first normal clock path 312 and a first test clock path 313. The first clock buffer 311 may receive the first data clock signals WCLK1 and WCLK1B transmitted from an external apparatus. The first normal clock path 312 may be coupled with the first clock buffer 311 and receive the first data clock signals WCLK1 and WCLK1B through the first clock buffer 311. The first normal clock path 312 may divide the first data clock signals WCLK1 and WCLK1B and generate a plurality of first divided clock signals DCLKI1, DCLKI1B, DCLKQ1 and DCLKQ1B. The first test clock path 313 may be coupled with the first clock buffer 311 and receive the first data clock signals WCLK1 and WCLK1B through the first clock buffer 311. The first test clock path 313 may buffer the first data clock signals WCLK1 and WCLK1B and generate first test clock signals TCLKI and TCLKIB.

The second clock generation circuit 320 may include a second clock buffer 321, a second normal clock path 322 and a second test clock path 323. The second clock buffer 321 may receive the second data clock signals WCLK2 and WCLK2B transmitted from the external apparatus. The second normal clock path 322 may be coupled with the second clock buffer 321 and receive the second data clock signals WCLK2 and WCLK2B through the second clock buffer 321. The second normal clock path 322 may divide the second data clock signals WCLK2 and WCLK2B and generate a plurality of second divided clock signals DCLKI2, DCLKI2B, DCLKQ2 and DCLKQ2B. The second test clock path 323 may be coupled with the second clock buffer 321 and receive the second data clock signals WCLK2 and WCLK2B through the second clock buffer 321. The second test clock path 323 may buffer the second data clock signals WCLK2 and WCLK2B and generate second test clock signals TCLKQ and TCLKQB.

The first clock generation circuit 310 may further include a clock multiplexer 314. The clock multiplexer 314 may receive the plurality of first divided clock signals DCLKI1, DCLKI1B, DCLKQ1 and DCLKQ1B, the first test clock signals TCLKI and TCLKIB and the second test clock signals TCLKQ and TCLKQB, and may output the first internal clock signals INCLK10, INCLK11, INCLK12 and INCLK13. The clock multiplexer 314 may output the plurality of first divided clock signals DCLKI1, DCLKI1B, DCLKQ1 and DCLKQ1B as the first internal clock signals INCLK10, INCLK11, INCLK12 and INCLK13 in the first operation mode. The clock multiplexer 314 may output the first and second test clock signals TCLKI, TCLKIB, TCLKQ and TCLKQB as the first internal clock signals INCLK10, INCLK11, INCLK12 and INCLK13 in the second operation mode. The clock multiplexer 314 may generate the first internal clock signals INCLK10, INCLK11, INCLK12 and INCLK13 based on an enable signal EN. The enable signal EN may be a signal which may be disabled in the first operation mode and be enabled in the second operation mode. The clock multiplexer 314 may provide the first and second test clock signals TCLKI, TCLKIB, TCLKQ and TCLKQB as the first internal clock signals INCLK10, INCLK11, INCLK12 and INCLK13 in a state in which the enable signal EN is enabled, and may provide the plurality of first divided clock signals DCLKI1, DCLKI1B, DCLKQ1 and DCLKQ1B as the first internal clock signals INCLK10, INCLK11, INCLK12 and INCLK13 in a state in which the enable signal EN is disabled.

The second clock generation circuit 320 may further include a clock multiplexer 324. The clock multiplexer 324 may receive the plurality of second divided clock signals DCLKI2, DCLKI2B, DCLKQ2 and DCLKQ2B, the first test clock signals TCLKI and TCLKIB and the second test clock signals TCLKQ and TCLKQB, and may output the second internal clock signals INCLK20, INCLK21, INCLK22 and INCLK23. The clock multiplexer 324 may output the plurality of second divided clock signals DCLKI2, DCLKI2B, DCLKQ2 and DCLKQ2B as the second internal clock signals INCLK20, INCLK21, INCLK22 and INCLK23 in the first operation mode. The clock multiplexer 324 may output the first and second test clock signals TCLKI, TCLKIB, TCLKQ and TCLKQB as the second internal clock signals INCLK20, INCLK21, INCLK22 and INCLK23 in the second operation mode. The clock multiplexer 324 may generate the second internal clock signals INCLK20, INCLK21, INCLK22 and INCLK23 based on the enable signal EN. The clock multiplexer 324 may provide the first and second test clock signals TCLKI, TCLKIB, TCLKQ and TCLKQB as the second internal clock signals INCLK20, INCLK21, INCLK22 and INCLK23 in a state in which the enable signal EN is enabled, and may provide the plurality of second divided clock signals DCLKI2, DCLKI2B, DCLKQ2 and DCLKQ2B as the second internal clock signals INCLK20, INCLK21, INCLK22 and INCLK23 in a state in which the enable signal EN is disabled.

The first clock generation circuit 310 and the second clock generation circuit 320 may further include clock switches 315 and 325, respectively. The clock switches 315 and 325 may be turned on based on switch control signals S and SB. The switch control signal SB may be a complementary signal of the switch control signal S. The switch control signals S and SB may be disabled in the first operation mode and be enabled in the second operation mode, similarly to the enable signal EN. The clock switch 315 may couple the first clock buffer 311 and the first test clock path 313 when the switch control signal S is enabled. The clock switch 315 may decouple the first clock buffer 311 and the first test clock path 313 when the switch control signal S is disabled. The clock switch 325 may couple the second clock buffer 321 and the second test clock path 323 when the switch control signal S is enabled. The clock switch 325 may decouple the second clock buffer 321 and the second test clock path 323 when the switch control signal S is disabled. Each of the clock switches 315 and 325 may include a plurality of pass gates which are turned on based on the switch control signals S and SB. In the second operation mode, the clock switches 315 and 325 allow the first and second data clock signals WCLK1, WCLK1B, WCLK2 and WCLK2B received through the first and second clock buffers 311 and 321 to be provided to the first and second test clock paths 313 and 323. In the first operation mode, the clock switches 315 and 325 may decouple the first clock buffer 311 and the first test clock path 313 from each other and the second clock buffer 321 and the second test clock path 323 from each other such that the loadings of the first and second test clock paths 313 and 323 do not exert influences on the first and second normal clock paths 312 and 322.

The first normal clock path 312 may include a divider 331 and a repeater 332. The divider 331 may receive the first data clock signals WCLK1 and WCLK1B received through the first clock buffer 311, divide the first data clock signals WCLK1 and WCLK1B and generate the plurality of first divided clock signals DCLKI1, DCLKI1B, DCLKQ1 and DCLKQ1B. When the first data clock signals WCLK1 and WCLK1B have the first frequency, the plurality of first divided clock signals DCLKI1, DCLKI1B, DCLKQ1 and DCLKQ1B may have the second frequency. The plurality of first divided clock signals DCLKI1, DCLKI1B, DCLKQ1 and DCLKQ1B may be four and have a phase difference of 90 degrees from one another. The repeater 332 may buffer the plurality of first divided clock signals DCLKI1, DCLKI1B, DCLKQ1 and DCLKQ1B and output the buffered divided clock signals to the clock multiplexer 314. The first test clock path 313 may include a repeater 333. The repeater 333 may receive the first data clock signals WCLK1 and WCLK1B received through the first clock buffer 311 and buffer the first data clock signals WCLK1 and WCLK1B. The repeater 333 may buffer the first data clock signals WCLK1 and WCLK1B and generate the first test clock signals TCLKI and TCLKIB. The first test clock signals TCLKI and TCLKIB may be two and have a phase difference of 180 degrees from each other. The repeater 333 may provide the first test clock signals TCLKI and TCLKIB to the clock multiplexers 314 and 324.

The second normal clock path 322 may include a divider 341 and a repeater 342. The divider 341 may receive the second data clock signals WCLK2 and WCLK2B received through the second clock buffer 321, divide the second data clock signals WCLK2 and WCLK2B and generate the plurality of second divided clock signals DCLKI2, DCLKI2B, DCLKQ2 and DCLKQ2B. When the second data clock signals WCLK2 and WCLK2B have the first frequency, the plurality of second divided clock signals DCLKI2, DCLKI2B, DCLKQ2 and DCLKQ2B may have the second frequency. The plurality of second divided clock signals DCLKI2, DCLKI2B, DCLKQ2 and DCLKQ2B may be four and have a phase difference of 90 degrees from one another. The repeater 342 may buffer the plurality of second divided clock signals DCLKI2, DCLKI2B, DCLKQ2 and DCLKQ2B and output the buffered divided clock signals to the clock multiplexer 324. The second test clock path 323 may include a repeater 343. The repeater 343 may receive the second data clock signals WCLK2 and WCLK2B received through the second clock buffer 321 and buffer the second data clock signals WCLK2 and WCLK2B. The repeater 343 may buffer the second data clock signals WCLK2 and WCLK2B and generate the second test clock signals TCLKQ and TCLKQB. The second test clock signals TCLKQ and TCLKQB may be two and have a phase difference of 180 degrees from each other. Further, the second test clock signals TCLKQ and TCLKQB may have a phase difference of 90 degrees from the first test clock signals TCLKI and TCLKIB. The repeater 343 may provide the second test clock signals TCLKQ and TCLKQB to the clock multiplexers 314 and 324.

Figure 4A:
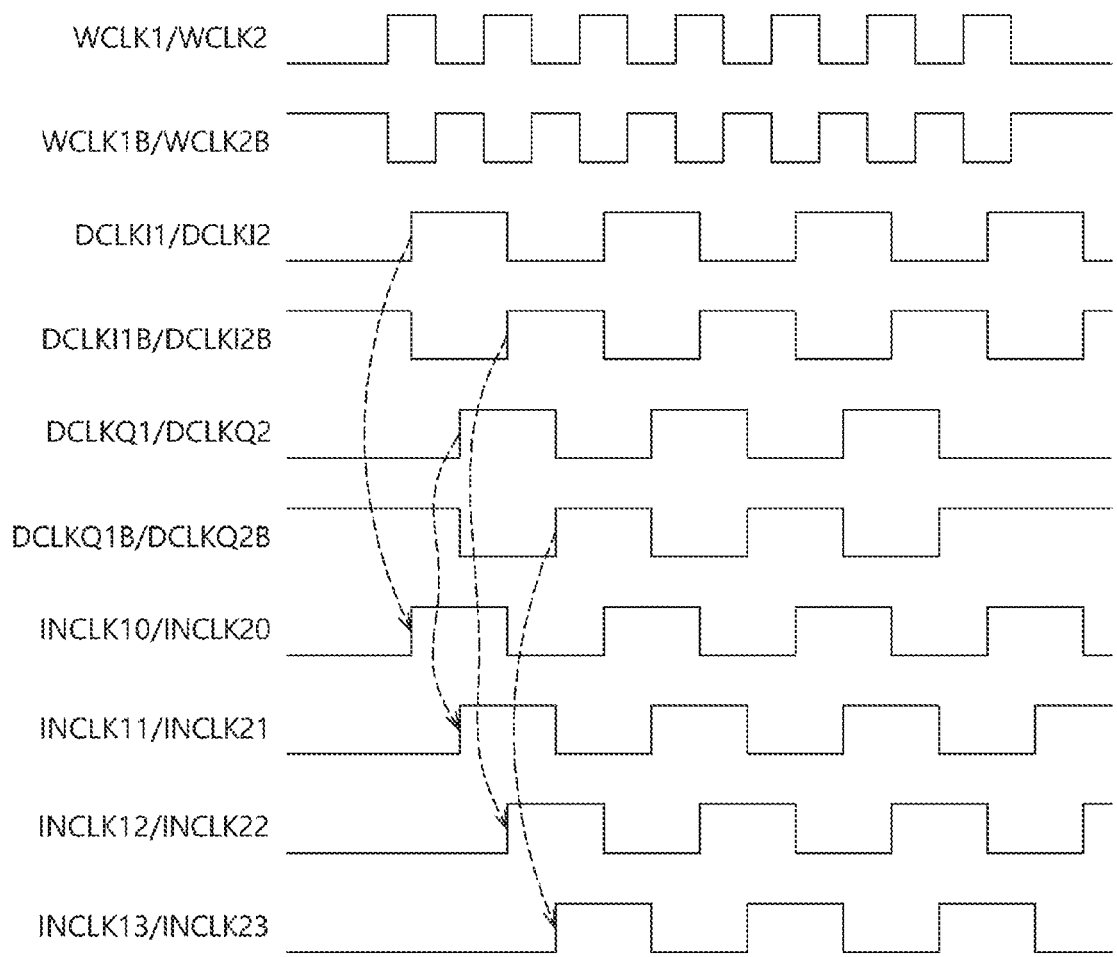

FIGS. 4a and 4b are representations of examples of waveform diagrams to assist in the explanation of the operations of the semiconductor system and the clock generation circuit in accordance with the embodiments. The operations of the semiconductor system 1, the semiconductor apparatus 200 and the clock generation circuit 300 in accordance with the embodiments will be described below with reference to FIGS. 1 to 4b. FIG. 4a is a diagram illustrating the waveforms of the clock signals in the first operation mode of the semiconductor apparatus 200. In the first operation mode of the semiconductor apparatus 200, the external apparatus 110 may be the host apparatus and provide the first data clock signals WCLK1 and WCLK1B and the second data clock signals WCLK2 and WCLK2B having the first frequency and the same phase to the semiconductor apparatus 200. The switch control signal S may be disabled, and the coupling of the first clock buffer 311 and the first test clock path 313 and the coupling of the second clock buffer 321 and the second test clock path 323 may be cut off. The first clock buffer 311 may receive the first data clock signals WCLK1 and WCLK1B, and the divider 331 may divide the first data clock signals WCLK1 and WCLK1B and generate the plurality of first divided clock signals DCLKI1, DCLKI1B, DCLKQ1 and DCLKQ1B having the second frequency and a phase difference of 90 degrees from one another. The repeater 332 may buffer the plurality of first divided clock signals DCLKI1, DCLKI1B, DCLKQ1 and DCLKQ1B and output the buffered divided clock signals to the clock multiplexer 314. The enable signal EN may be disabled, and the clock multiplexer 314 may output the plurality of first divided clock signals DCLKI1, DCLKI1B, DCLKQ1 and DCLKQ1B as the first internal clock signals INCLK10, INCLK11, INCLK12 and INCLK13. The first internal clock signals INCLK10, INCLK11, INCLK12 and INCLK13 may be provided to the first data input/output circuit 212, and the first data input/output circuit 212 may perform input/output operations for data based on the first internal clock signals INCLK10, INCLK11, INCLK12 and INCLK13. The second clock buffer 321 may receive the second data clock signals WCLK2 and WCLK2B, and the divider 341 may divide the second data clock signals WCLK2 and WCLK2B and generate the plurality of second divided clock signals DCLKI2, DCLKI2B, DCLKQ2 and DCLKQ2B having the second frequency and a phase difference of 90 degrees from one another. The repeater 342 may buffer the plurality of second divided clock signals DCLKI2, DCLKI2B, DCLKQ2 and DCLKQ2B and output the buffered divided clock signals to the clock multiplexer 324. The clock multiplexer 324 may output the plurality of second divided clock signals DCLKI2, DCLKI2B, DCLKQ2 and DCLKQ2B as the second internal clock signals INCLK20, INCLK21, INCLK22 and INCLK23 based on the disabled enable signal EN. The second internal clock signals INCLK20, INCLK21, INCLK22 and INCLK23 may be provided to the second data input/output circuit 222, and the second data input/output circuit 222 may perform input/output operations for data based on the second internal clock signals INCLK20, INCLK21, INCLK22 and INCLK23.

FIG. 4b is a diagram illustrating the waveforms of the clock signals in the second operation mode of the semiconductor apparatus 200. In the second operation mode of the semiconductor apparatus 200, the external apparatus 110 may be the test equipment and provide the first data clock signals WCLK1 and WCLK1B having the second frequency and the second data clock signals WCLK2 and WCLK2B having the second frequency and a phase difference of 90 degrees from the first data clock signals WCLK1 and WCLK1B. The switch control signal S may be enabled, and the first clock buffer 311 and the second clock buffer 321 may be coupled with the first test clock path 313 and the second test clock path 323, respectively. The repeater 333 may buffer the first data clock signals WCLK1 and WCLK1B and generate the first test clock signals TCLKI and TCLKIB. The first test clock signals TCLKI and TCLKIB may have the second frequency and a phase difference of 180 degrees from each other. The first test clock signals TCLKI and TCLKIB may be provided to the clock multiplexers 314 and 324. The repeater 343 may buffer the second data clock signals WCLK2 and WCLK2B and generate the second test clock signals TCLKQ and TCLKQB. The second test clock signals TCLKQ and TCLKQB may have the second frequency and a phase difference of 180 degrees from each other. The second test clock signals TCLKQ and TCLKQB may be provided to the clock multiplexers 314 and 324. The enable signal EN may be enabled, and the clock multiplexer 314 may provide the first and second test clock signals TCLKI, TCLKIB, TCLKQ and TCLKQB as the first internal clock signals INCLK10, INCLK11, INCLK12 and INCLK13. Since the second data clock signals WCLK2 and WCLK2B have the phase difference of 90 degrees from the first data clock signals WCLK1 and WCLK1B, the second test clock signals TCLKQ and TCLKQB may have a phase difference of 90 degrees from the first test clock signals TCLKI and TCLKIB. Therefore, the first test clock signals TCLKI and TCLKIB and the second test clock signals TCLKQ and TCLKQB may be four clock signals which have the phase difference of 90 degrees, and may have phases corresponding to the first divided clock signals DCLKI1, DCLKI1B, DCLKQ1 and DCLKQ1B and the second divided clock signals DCLKI2, DCLKI2B, DCLKQ2 and DCLKQ2B. The first internal clock signals INCLK10, INCLK11, INCLK12 and INCLK13 may be provided to the first data input/output circuit 212, and the first data input/output circuit 212 may perform input/output operations for data based on the first internal clock signals INCLK10, INCLK11, INCLK12 and INCLK13. The clock multiplexer 324 may provide the first and second test clock signals TCLKI, TCLKIB, TCLKQ and TCLKQB as the second internal clock signals INCLK20, INCLK21, INCLK22 and INCLK23. The second internal clock signals INCLK20, INCLK21, INCLK22 and INCLK23 may be provided to the second data input/output circuit 222, and the second data input/output circuit 222 may perform input/output operations for data based on the second internal clock signals INCLK20, INCLK21, INCLK22 and INCLK23. As described above, the semiconductor apparatus 200 may generate internal clock signals having the second frequency and the phase difference of 90 degrees in both of the first and second operation modes. Even when the external apparatus 110 does not provide high-speed clock signals in the second operation mode, the semiconductor apparatus 200 may generate internal clock signals having substantially the same frequency and phase difference as the internal clock signals generated in the first operation mode.

FIG. 5 is a diagram illustrating a representation of an example of the configuration of a clock generation circuit 500 in accordance with an embodiment. The clock generation circuit 500 may include a first clock generation circuit 510 which is disposed in a first byte region Byte 1 and a second clock generation circuit 520 which is disposed in a second byte region Byte 2. The first clock generation circuit 510 may include a first clock buffer 511, a first auxiliary clock buffer 516, a first normal clock path 512, a first test clock path 513 and a clock multiplexer 514. The second clock generation circuit 520 may include a second clock buffer 521, a second auxiliary clock buffer 526, a second normal clock path 522, a second test clock path 523 and a clock multiplexer 524. Referring to FIG. 5, the clock generation circuit 500 may include the first auxiliary clock buffer 516 and the second auxiliary clock buffer 526 in replacement of the clock switches 315 and 325 illustrated in FIG. 3. The clock generation circuit 500 may include the first and second auxiliary clock buffers 516 and 526 for receiving first and second data clock signals WCLK1, WCLK1B, WCLK2 and WCLK2B, respectively, in the second operation mode of the semiconductor apparatus 200. The first clock buffer 511 may receive the first data clock signals WCLK1 and WCLK1B and provide the first data clock signals WCLK1 and WCLK1B to the first normal clock path 512. The first auxiliary clock buffer 516 may receive the first data clock signals WCLK1 and WCLK1B and provide the first data clock signals WCLK1 and WCLK1B to the first test clock path 513. The second clock buffer 521 may receive the second data clock signals WCLK2 and WCLK2B and provide the second data clock signals WCLK2 and WCLK2B to the second normal clock path 522. The second auxiliary clock buffer 526 may receive the second data clock signals WCLK2 and WCLK2B and provide the second data clock signals WCLK2 and WCLK2B to the second test clock path 523.

The first normal clock path 512 may be coupled with the first clock buffer 511 and receive the first data clock signals WCLK1 and WCLK1B from the first clock buffer 511. The first normal clock path 512 may include a divider 531 and a repeater 532. The divider 531 may divide the first data clock signals WCLK1 and WCLK1B and generate a plurality of first divided clock signals DCLKI1, DCLKI1B, DCLKQ1 and DCLKQ1B. The repeater 532 may buffer the plurality of first divided clock signals DCLKI1, DCLKI1B, DCLKQ1 and DCLKQ1B and provide the buffered divided clock signals to the clock multiplexer 514. The first test clock path 513 may be coupled with the first auxiliary clock buffer 516 and receive the first data clock signals WCLK1 and WCLK1B from the first auxiliary clock buffer 516. The first test clock path 513 may include a repeater 533. The repeater 533 may buffer the first data clock signals WCLK1 and WCLK1B and generate first test clock signals TCLKI and TCLKIB. The first test clock signals TCLKI and TCLKIB may be provided to the clock multiplexers 514 and 524.

The second normal clock path 522 may be coupled with the second clock buffer 521 and receive the second data clock signals WCLK2 and WCLK2B from the second clock buffer 521. The second normal clock path 522 may include a divider 541 and a repeater 542. The divider 541 may divide the second data clock signals WCLK2 and WCLK2B and generate a plurality of second divided clock signals DCLKI2, DCLKI2B, DCLKQ2 and DCLKQ2B. The repeater 542 may buffer the plurality of second divided clock signals DCLKI2, DCLKI2B, DCLKQ2 and DCLKQ2B and provide the buffered divided clock signals to the clock multiplexer 524. The second test clock path 523 may be coupled with the second auxiliary clock buffer 526 and receive the second data clock signals WCLK2 and WCLK2B from the second auxiliary clock buffer 526. The second test clock path 523 may include a repeater 543. The repeater 543 may buffer the second data clock signals WCLK2 and WCLK2B and generate second test clock signals TCLKQ and TCLKQB. The second test clock signals TCLKQ and TCLKQB may be provided to the clock multiplexers 514 and 524.

The clock multiplexer 514 may provide the plurality of first divided clock signals DCLKI1, DCLKI1B, DCLKQ1 and DCLKQ1B as first internal clock signals INCLK10, INCLK11, INCLK12 and INCLK13 based on an enable signal EN which is disabled, in the first operation mode of the semiconductor apparatus 200. The clock multiplexer 514 may provide the first and second test clock signals TCLKI, TCLKIB, TCLKQ and TCLKQB as the first internal clock signals INCLK10, INCLK11, INCLK12 and INCLK13 based on the enable signal EN which is enabled, in the second operation mode of the semiconductor apparatus 200.

The clock multiplexer 524 may provide the plurality of second divided clock signals DCLKI2, DCLKI2B, DCLKQ2 and DCLKQ2B as second internal clock signals INCLK20, INCLK21, INCLK22 and INCLK23 based on the enable signal EN which is disabled, in the first operation mode of the semiconductor apparatus 200. The clock multiplexer 524 may provide the first and second test clock signals TCLKI, TCLKIB, TCLKQ and TCLKQB as the second internal clock signals INCLK20, INCLK21, INCLK22 and INCLK23 based on the enable signal EN which is enabled, in the second operation mode of the semiconductor apparatus 200.

FIG. 6 is a diagram illustrating a representation of an example of the configuration of a clock generation circuit 600 in accordance with an embodiment. The clock generation circuit 600 may have substantially the same configuration as the clock generation circuit 500 illustrated in FIG. 5. Similar reference numerals are used for the same components, and repeated descriptions for the same components will be omitted herein. The clock generation circuit 600 may further include a duty detection circuit 650. The duty detection circuit 650 may receive first and second test clock signals TCLKI, TCLKIB, TCLKQ and TCLKQB and detect the phases of the first and second test clock signals TCLKI, TCLKIB, TCLKQ and TCLKQB. Clock multiplexers 614 and 624 may be coupled with the outputs of the duty detection circuit 650 and receive the first and second test clock signals TCLKI, TCLKIB, TCLKQ and TCLKQB which are outputted from the duty detection circuit 650. The duty detection circuit 650 may generate a duty information DCS by detecting the phases of the first and second test clock signals TCLKI, TCLKIB, TCLKQ and TCLKQB. The duty detection circuit 650 may provide the duty information DCS to the external apparatus 110. The external apparatus 110 may adjust the phases of first and second data clock signals WCLK1, WCLK1B, WCLK2 and WCLK2B based on the duty information DCS. In the second operation mode, the first and second data clock signals WCLK1, WCLK1B, WCLK2 and WCLK2B may be buffered by repeaters 633 and 643 and be provided as the first and second test clock signals TCLKI, TCLKIB, TCLKQ and TCLKQB, and the first and second test clock signals TCLKI, TCLKIB, TCLKQ and TCLKQB may be provided as first internal clock signals INCLK10, INCLK11, INCLK12 and INCLK13 and second internal clock signals INCLK20, INCLK21, INCLK22 and INCLK23. In this regard, in order for normal operations of the data input/output circuits 212 and 222, the first and second test clock signals TCLKI, TCLKIB, TCLKQ and TCLKQB should retain a precise phase difference. However, because the first and second test clock signals TCLKI, TCLKIB, TCLKQ and TCLKQB are generated from different test clock paths, the phases thereof may vary due to differences in loading and skew. That is to say, even when the first and second data clock signals WCLK1, WCLK1B, WCLK2 and WCLK2B have a phase difference of 90 degrees, the first and second test clock signals TCLKI, TCLKIB, TCLKQ and TCLKQB may not retain the phase difference of 90 degrees. The duty detection circuit 650 may detect the phases of the first and second test clock signals TCLKI, TCLKIB, TCLKQ and TCLKQB and provide the phase information PCS to the external apparatus 110 such that the external apparatus 110 may change the phases of the first and second data clock signals WCLK1, WCLK1B, WCLK2 and WCLK2B based on the phase information PCS. Hence, differences in loading and skew between first and second test clock paths 613 and 623 may be compensated for. In an embodiment, a duty correction circuit may be used in replacement of the duty detection circuit 650. The duty correction circuit may detect the phases of the first and second test clock signals TCLKI, TCLKIB, TCLKQ and TCLKQB and adjust by itself the phases of the first and second test clock signals TCLKI, TCLKIB, TCLKQ and TCLKQB depending on a detection result.

While various embodiments have been described above, it will be understood to those skilled in the art that the embodiments described are examples only. Accordingly, the semiconductor apparatus including a clock generation circuit and the semiconductor system described herein should not be limited based on the described embodiments.

What is claimed is:

1. A semiconductor apparatus comprising:
a clock generation circuit configured to receive data clock signals externally from the semiconductor apparatus, receive a first clock signal pair having a first frequency as the data clock signals in a first operation mode, receive a second clock signal pair having a second frequency and a third clock signal pair having a predetermined phase difference from the second clock signal pair as the data clock signals in a second operation mode, and generate a plurality of internal clock signals having the second frequency; and
a data input and output (input/output) circuit configured to receive or transmit data based on the plurality of internal clock signals.

2. The semiconductor apparatus according to claim 1, wherein the second frequency is half of the first frequency.

3. The semiconductor apparatus according to claim 1, wherein the predetermined phase difference is 90 degrees.

4. The semiconductor apparatus according to claim 1, wherein the clock generation circuit comprises:
a first clock generation circuit configured to receive first data clock signals and generate a plurality of first internal clock signals; and
a second clock generation circuit configured to receive second data clock signals and generate a plurality of second internal clock signals,
wherein the first clock generation circuit receives the first clock signal pair as the first data clock signals in the first operation mode and receives the second clock signal pair as the first data clock signals in the second operation mode, and
wherein the second clock generation circuit receives the first clock signal pair as the second data clock signals in the first operation mode and receives the third clock signal pair as the second data clock signals in the second operation mode.

5. The semiconductor apparatus according to claim 4, wherein the first clock generation circuit comprises:
a first clock buffer configured to receive the first data clock signals;
a first normal clock path coupled with the first clock buffer, and configured to receive the first data clock signals, divide the first data clock signals and generate a plurality of first divided clock signals; and
a first test clock path coupled with the first clock buffer, and configured to receive the first data clock signals, buffer the first data clock signals and generate first test clock signals.

6. The semiconductor apparatus according to claim 5, wherein the first clock generation circuit further comprises:
a clock switch configured to cut off coupling between the first clock buffer and the first test clock path based on switch control signals.

7. The semiconductor apparatus according to claim 5, wherein the second clock generation circuit comprises:
a second clock buffer configured to receive the second data clock signals;
a second normal clock path coupled with the second clock buffer, and configured to receive the second data clock signals, divide the second data clock signals and generate a plurality of second divided clock signals; and
a second test clock path coupled with the second clock buffer, and configured to receive the second data clock signals, buffer the second data clock signals and generate second test clock signals.

8. The semiconductor apparatus according to claim 7, wherein the second clock generation circuit further comprises:
a clock switch configured to cut off coupling between the second clock buffer and the second test clock path based on the switch control signals.

9. The semiconductor apparatus according to claim 7, wherein the first clock generation circuit further comprises:
a clock multiplexer configured to provide the plurality of first divided clock signals as the plurality of first internal clock signals in the first operation mode, and provide the first test clock signals and the second test clock signals as the plurality of first internal clock signals in the second operation mode.

10. The semiconductor apparatus according to claim 7, wherein the second clock generation circuit further comprises:
a clock multiplexer configured to provide the plurality of second divided clock signals as the plurality of second internal clock signals in the first operation mode, and provide the first test clock signals and the second test clock signals as the plurality of second internal clock signals in the second operation mode.

11. The semiconductor apparatus according to claim 4, wherein the first clock generation circuit comprises:
a first clock buffer configured to receive the first data clock signals;
a first auxiliary clock buffer configured to receive the first data clock signals;
a first normal clock path coupled with the first clock buffer, and configured to receive the first data clock signals, divide the first data clock signals and generate a plurality of first divided clock signals; and
a first test clock path coupled with the first auxiliary clock buffer, and configured to receive the first data clock signals, buffer the first data clock signals and generate first test clock signals.

12. The semiconductor apparatus according to claim 11, wherein the second clock generation circuit comprises:
a second clock buffer configured to receive the second data clock signals;
a second auxiliary clock buffer configured to receive the second data clock signals;
a second normal clock path coupled with the second clock buffer, and configured to receive the second data clock signals, divide the second data clock signals and generate a plurality of second divided clock signals; and
a second test clock path coupled with the second auxiliary clock buffer, and configured to receive the second data clock signals, buffer the second data clock signals and generate second test clock signals.

13. The semiconductor apparatus according to claim 12, wherein the first clock generation circuit further comprises:
a clock multiplexer configured to provide the plurality of first divided clock signals as the plurality of first internal clock signals in the first operation mode, and provide the first test clock signals and the second test clock signals as the plurality of first internal clock signals in the second operation mode.

14. The semiconductor apparatus according to claim 12, wherein the second clock generation circuit further comprises:
a clock multiplexer configured to provide the plurality of second divided clock signals as the plurality of second internal clock signals in the first operation mode, and provide the first test clock signals and the second test clock signals as the plurality of second internal clock signals in the second operation mode.

15. The semiconductor apparatus according to claim 4, wherein the data input/output circuit comprises:
a first data input/output circuit configured to perform input/output operations for data based on the plurality of first internal clock signals; and
a second data input/output circuit configured to perform input/output operations for data based on the plurality of second internal clock signals.

16. A semiconductor system comprising:
an external apparatus configured to provide first data clock signals and second data clock signals having the same frequency as the first data clock signals and having a phase difference from the first data clock signals, and adjust phases of the first and second data clock signals based on duty information; and
a semiconductor apparatus configured to generate first test clock signals and second test clock signals based on the first and second data clock signals, provide the first and second test clock signals as a plurality of internal clock signals, and generate the duty information by detecting duty ratios of the first and second test clock signals.

17. The semiconductor system according to claim 16, wherein the semiconductor apparatus comprises:
a clock generation circuit configured to generate the first and second test clock signals by buffering the first and second data clock signals, and provide the first and second test clock signals as the plurality of internal clock signals; and
a data input and output (input/output) circuit configured to perform data input/output operations based on the plurality of internal clock signals.

18. The semiconductor system according to claim 17, wherein the clock generation circuit comprises:
a first test clock path configured to receive the first data clock signals and generate the first test clock signals;
a second test clock path configured to receive the second data clock signals and generate the second test clock signals;
a duty detection circuit configured to generate the duty information by comparing phases of the first and second test clock signals; and
clock multiplexers configured to generate the plurality of internal clock signals based on the first and second test clock signals outputted from the duty detection circuit.

19. The semiconductor system according to claim 18, wherein the clock generation circuit further comprises:
an auxiliary clock buffer configured to receive the first data clock signals and provide the first data clock signals to the first test clock path.

20. The semiconductor system according to claim 18, wherein the clock generation circuit further comprises:
an auxiliary clock buffer configured to receive the second data clock signals and provide the second data clock signals to the second test clock path.

21. A semiconductor apparatus comprising:
a clock generation circuit configured to receive data clock signals and generate internal clock signals in both a first and second operation modes based on the received data clock signals, the data clock signals received in the first operation mode having a different frequency from the data clock signals received in the second operation mode and the internal clock signals generated in the first operation mode having substantially the same frequency and phase difference as the internal clock signals generated in the second operation mode.

22. The semiconductor apparatus according to claim 21, further comprising:
a data input and output (input/output) circuit configured to receive or transmit data based on the plurality of internal clock signals, and
wherein the data clock signals are received externally from the semiconductor apparatus.

* * * * *